(12) United States Patent
Ota

(10) Patent No.: US 10,542,625 B2
(45) Date of Patent: Jan. 21, 2020

(54) WIRING SUBSTRATE

(71) Applicant: SHINKO ELECTRIC INDUSTRIES CO., LTD., Nagano-shi, Nagano-ken (JP)

(72) Inventor: Takayuki Ota, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/432,035

(22) Filed: Jun. 5, 2019

(65) Prior Publication Data
US 2019/0380203 A1 Dec. 12, 2019

(30) Foreign Application Priority Data
Jun. 11, 2018 (JP) .................. 2018-111171

(51) Int. Cl.
*H05K 1/11* (2006.01)
*H05K 1/03* (2006.01)
(Continued)

(52) U.S. Cl.
CPC ........... *H05K 1/115* (2013.01); *H05K 1/0366* (2013.01); *H05K 3/0032* (2013.01); *H05K 3/188* (2013.01); *H05K 3/424* (2013.01); *H05K 3/429* (2013.01); *H05K 1/0373* (2013.01); *H05K 2201/09827* (2013.01); *H05K 2203/072* (2013.01);
(Continued)

(58) Field of Classification Search
CPC .... H05K 1/115; H05K 1/0366; H05K 1/0373; H05K 1/0298; H05K 3/0032; H05K 3/188; H05K 3/424; H05K 3/429; H05K 3/0035; H05K 3/426; H05K 2201/09827; H05K 2201/09581; H05K 2203/072;
(Continued)

(56) References Cited

U.S. PATENT DOCUMENTS

2001/0032700 A1* 10/2001 Nishii .................. H05K 3/0032
156/272.2
2006/0175084 A1* 8/2006 Okamoto ............... H05K 3/445
174/262
(Continued)

FOREIGN PATENT DOCUMENTS

JP 2007103605 A 4/2007
WO 2005013653 A1 2/2005

*Primary Examiner* — Roshn K Varghese
(74) *Attorney, Agent, or Firm* — Tarolli, Sundheim, Covell & Tummino LLP

(57) ABSTRACT

A wiring substrate includes a first wiring layer; a first insulation layer including a reinforcement material and a first opening extending through the reinforcement material and exposing a partial region of an upper surface of the first wiring layer, in which an end of the reinforcement material projects in the first opening; a second insulation layer not including a reinforcement material, covering an upper surface of the first insulation layer, a wall surface of the first opening, and a first part of the partial region and an entire surface of the reinforcement material projecting in the first opening, and including a second opening exposing a second part of the partial region; and a second wiring layer including a wiring portion formed on an upper surface of the second insulation layer and a via portion formed in the second opening and connecting the wiring portion to the first wiring layer.

12 Claims, 8 Drawing Sheets

(51) Int. Cl.
    *H05K 3/18*     (2006.01)
    *H05K 3/00*     (2006.01)
    *H05K 3/42*     (2006.01)

(52) U.S. Cl.
    CPC ............ *H05K 2203/0723* (2013.01); *H05K 2203/107* (2013.01)

(58) Field of Classification Search
    CPC ..... H05K 2203/0723; H05K 2203/107; H05K 2203/143
    See application file for complete search history.

(56) References Cited

U.S. PATENT DOCUMENTS

| | | | |
|---|---|---|---|
| 2006/0223307 A1* | 10/2006 | Gotoh | H05K 3/421 438/640 |
| 2007/0077391 A1 | 4/2007 | Okamoto et al. | |
| 2008/0164057 A1 | 7/2008 | Mori et al. | |
| 2009/0229874 A1* | 9/2009 | Katagiri | H05K 3/0035 174/262 |
| 2010/0024963 A1 | 2/2010 | Okamoto et al. | |
| 2013/0052409 A1* | 2/2013 | Balcome | B32B 3/10 428/131 |
| 2015/0027758 A1* | 1/2015 | Maeda | H05K 3/421 174/255 |

\* cited by examiner

WIRING SUBSTRATE

CROSS-REFERENCE TO RELATED APPLICATIONS

This application is based upon and claims the benefit of priority from prior Japanese Patent Application No. 2018-111171, filed on Jun. 11, 2018, the entire contents of which are incorporated herein by reference.

FIELD

This disclosure relates to a wiring substrate and a method for manufacturing a wiring substrate.

BACKGROUND

In a typical build-up wiring substrate, wiring layers and insulation layers are alternately stacked, and via holes extend through the insulation layers and connect the wiring layers to each other. Such a wiring substrate includes an insulation layer in which a reinforcement material formed by a given fiber is impregnated with an insulative resin (refer to International Patent Publication No. 2005/013653 and Japanese Laid-Open Patent Publication No. 2007-103605).

The via holes described above are formed by irradiating the insulation layer including the reinforcement material with laser beams. When the via holes are formed in this manner, the reinforcement material may project from wall surfaces of the via holes. Projection of the reinforcement material in a via hole may form a void in the via wiring. This may lower the connection reliability.

SUMMARY

An embodiment of a wiring substrate includes a first wiring layer, a first insulation layer, a second insulation layer, and a second wiring layer. The first insulation layer is formed from an insulative resin that includes a reinforcement material. The first insulation layer includes a first opening extending through the reinforcement material and exposing a partial region of an upper surface of the first wiring layer. The reinforcement material has an end projecting in the first opening. The second insulation layer is formed from an insulative resin that does not include a reinforcement material and covers an upper surface of the first insulation layer, a wall surface of the first opening, and a first part of the partial region of the upper surface of the first wiring layer exposed in the first opening. The second insulation layer includes a second opening exposing a second part of the partial region of the upper surface of the first wiring layer in the first opening and covers an entire surface of the reinforcement material projecting in the first opening. The second wiring layer includes a wiring portion formed on an upper surface of the second insulation layer and a via portion formed in the second opening and connecting the wiring portion to the first wiring layer. The first opening of the first insulation layer has an open width that decreases from the upper surface of the first insulation layer toward the first wiring layer. The second opening of the second insulation layer has an open width that decreases from the upper surface of the second insulation layer toward the first wiring layer.

An embodiment of a method for manufacturing a wiring substrate includes forming a first wiring layer, forming a first insulation layer from an insulative resin that includes a reinforcement material to cover the first wiring layer, irradiating the first insulation layer with a laser beam to form a first opening that extends through the reinforcement material and exposes a partial region of an upper surface of the first wiring layer, in which the first opening has an open width that decreases from an upper surface of the first insulation layer toward the first wiring layer, forming a second insulation layer from an insulative resin that does not include a reinforcement material to cover an upper surface of the first insulation layer, a wall surface of the first opening, and the partial region of the upper surface of the first wiring layer exposed in the first opening, irradiating the second insulation layer with a laser beam to form a second opening, in which the second opening extends through the second insulation layer located in the first opening and exposes a part of the partial region of the upper surface of the first wiring layer, the second insulation layer covers an entire surface of the reinforcement material projecting in the first opening, and the second opening has an open width that decreases from an upper surface of the second insulation layer toward the first wiring layer, and forming a second wiring layer that includes a wiring portion arranged on an upper surface of the second insulation layer and a via portion arranged in the second opening to connect the wiring portion to the first wiring layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
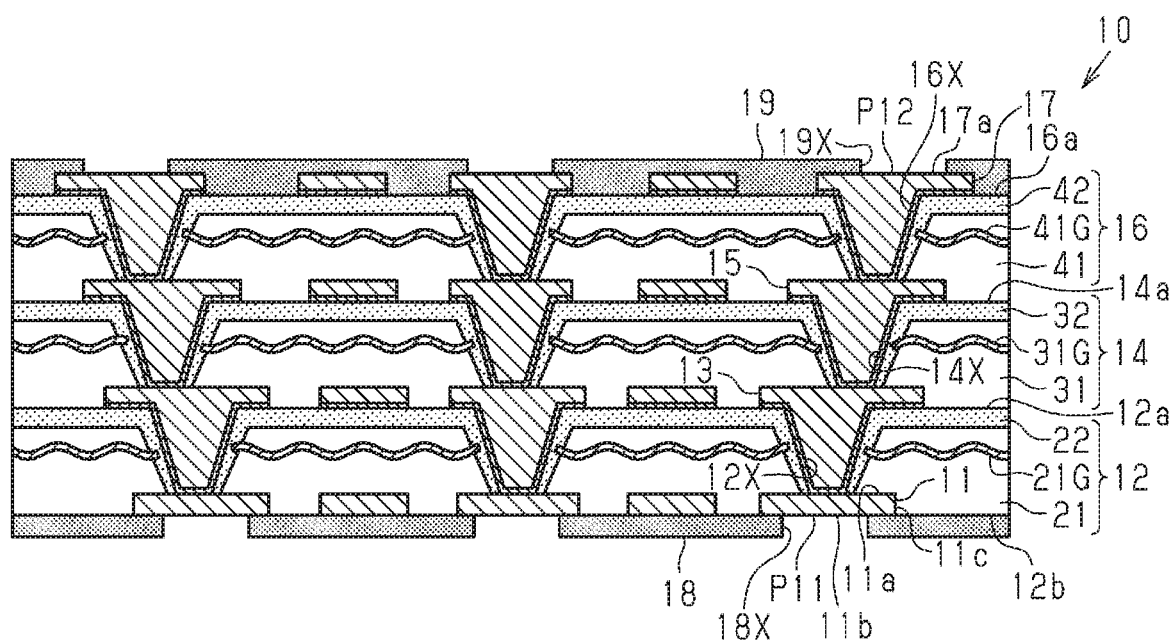
FIG. 1 is a schematic cross-sectional view illustrating a first embodiment of a wiring substrate.

Embodiments will now be described with reference to the accompanying drawings. Elements in the drawings may be partially enlarged to facilitate understanding and thus do not necessarily have to be drawn to scale. Also, to clarify cross-sectional structures of elements, hatching lines may not be illustrated or replaced by shadings in the cross-sectional drawings.

First Embodiment

A first embodiment of a wiring substrate 10 will now be described.

As illustrated in FIG. 1, the wiring substrate 10 includes a wiring layer 11, an insulation layer 12, a wiring layer 13, an insulation layer 14, a wiring layer 15, an insulation layer 16, a wiring layer 17, and solder resist layers 18 and 19.

The insulation layer 12 covers a portion of an upper surface 11a of the wiring layer 11 and side surfaces of the wiring layer 11. The material of the wiring layer 11 may be, for example, copper (Cu) or an alloy of Cu.

The insulation layer 12 includes openings 12X partially exposing the upper surface 11a of the wiring layer 11. The openings 12X may also be referred to as via holes. In the present example, a lower surface 12b of the insulation layer 12 is substantially flush with a lower surface 11b of the wiring layer 11.

The insulation layer 12 includes insulation layers 21 and 22. The insulation layer 21 includes a reinforcement material 21G. The insulation layer 22 does not include reinforcement materials. The insulation layer 21 is formed by impregnating the reinforcement material 21G with an insulative resin. The reinforcement material 21G may be, for example, a woven cloth or a nonwoven cloth formed by glass fibers, carbon fibers, or aramid fibers. The insulative resin of the insulation layer 21 may be, for example, an epoxy resin, an imide resin, a phenol resin, or a cyanate resin. The insulative resin of the insulation layer 21 may be, for example, a thermosetting resin. The insulation layer 21 may include, for example, a filler such as silica or alumina.

The insulative resin of the insulation layer 22 may be an epoxy resin, an imide resin, a phenol resin, or a cyanate resin. The insulative resin of the insulation layer 22 may be, for example, a thermosetting resin. The insulation layer 22 may include, for example, a filler such as silica or alumina.

Figure 2:
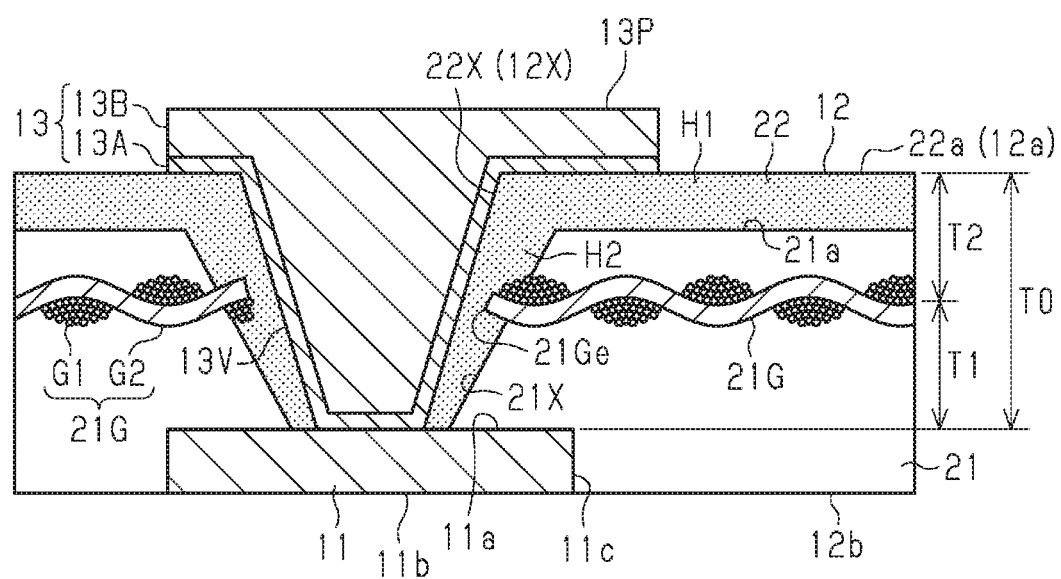
FIG. 2 is an enlarged cross-sectional view illustrating a portion of the wiring substrate illustrated in FIG. 1.

As illustrated in FIG. 2, the wiring layer 13 includes via portions 13B extending through the insulation layer 12 and wiring portions 13P formed on an upper surface 12a of the insulation layer 12. The wiring portions 13P are connected to the wiring layer 11 by the via portions 13B. The material of the wiring layer 13 may be, for example, Cu or an alloy of Cu.

Referring again to FIG. 1, the insulation layer 14 is formed on the upper surface 12a of the insulation layer 12. The insulation layer 14 covers the upper surface 12a of the insulation layer 12, a portion of the upper surface of the wiring layer 13, and side surfaces of the wiring layer 13. The insulation layer 14 includes openings 14X partially exposing the upper surface of the wiring layer 13. The openings 14X may also be referred to as via holes.

The insulation layer 14 includes insulation layers 31 and 32. The insulation layer 31 includes a reinforcement material 31G. The insulation layer 32 does not include reinforcement materials. The insulation layer 31 is formed by impregnating the reinforcement material 31G with an insulative resin. The reinforcement material 31G may be, for example, a woven cloth or a nonwoven cloth formed by glass fibers, carbon fibers, or aramid fibers. The insulative resin of the insulation layer 31 may be, for example, an epoxy resin, an imide resin, a phenol resin, or a cyanate resin. The insulative resin of the insulation layer 31 may be, for example, a thermosetting resin. The insulation layer 31 may include, for example, a filler such as silica or alumina.

The insulative resin of the insulation layer 32 may be, for example, an epoxy resin, an imide resin, a phenol resin, or a cyanate resin. The insulative resin of the insulation layer 32 may be, for example, a thermosetting resin. The insulation layer 32 may include, for example, a filler such as silica or alumina.

The wiring layer 15 includes via portions that extend through the insulation layer 14 and wiring portions that are connected to the wiring layer 13 by the via portions. The material of the wiring layer 15 may be, for example, Cu or an alloy of Cu.

The insulation layer 16 includes insulation layers 41 and 42. The insulation layer 41 includes a reinforcement material 41G. The insulation layer 42 does not include reinforcement materials. The insulation layer 41 is formed by impregnating the reinforcement material 41G with an insulative resin. The reinforcement material 41G may be, for example, a woven cloth or a nonwoven cloth formed by glass fibers, carbon fibers, or aramid fibers. The insulative resin of the insulation layer 41 may be, for example, an epoxy resin, an imide resin, a phenol resin, or a cyanate resin. The insulative resin of the insulation layer 41 may be, for example, a thermosetting resin. The insulation layer 41 may include, for example, a filler such as silica or alumina.

The insulative resin of the insulation layer 42 may be, for example, an epoxy resin, an imide resin, a phenol resin, or a cyanate resin. The insulative resin of the insulation layer 42 may be, for example, a thermosetting resin. The insulation layer 42 may include, for example, a filler such as silica or alumina.

The insulation layer 16 is formed on an upper surface 14a of the insulation layer 14. The insulation layer 16 covers the upper surface 14a of the insulation layer 14, a portion of the upper surface of the wiring layer 15, and side surfaces of the wiring layer 15. The insulation layer 16 includes openings 16X partially exposing the upper surface of the wiring layer 15. The openings 16X may also be referred to as via holes.

The wiring layer 17 includes via portions that extend through the insulation layer 16 and wiring portions that are connected to the wiring layer 15 by the via portions. The material of the wiring layer 17 may be, for example, Cu or an alloy of Cu.

The solder resist layer 18 is formed on the lower surface 12b of the insulation layer 12. The solder resist layer 18 covers the lower surface 12b of the insulation layer 12 and a portion of the lower surface 11b of the wiring layer 11. The solder resist layer 18 includes openings 18X partially exposing the lower surface 11b of the wiring layer 11 as external connection pads P11. The material of the solder resist layer 18 may be, for example, an insulative resin such as an epoxy resin or an acrylic resin.

As necessary, an organic solderability preservative (OSP) process may be performed to form an OSP film on the surface (lower surface 11b in FIG. 1) of the wiring layer 11 exposed in the openings 18X of the solder resist layer 18. Alternatively, a metal layer may be formed on the lower surface 11b of the wiring layer 11 exposed in the openings 18X. Examples of the metal layer include an Au layer, an Ni layer/Au layer (metal layer in which an Ni layer serves as the bottom layer, and an Au layer is formed on the Ni layer), and an Ni layer/Pd layer/Au layer (metal layer in which an Ni layer serves as the bottom layer, and the Ni layer, a Pd layer, and an Au layer are stacked in this order). The OSP film or the metal layer formed on the lower surface 11b of the wiring layer 11 exposed in the openings 18X may be used as the external connection pads P11.

The solder resist layer 19 is formed on an upper surface 16a of the insulation layer 16. The solder resist layer 19 covers the upper surface 16a of the insulation layer 16 and a portion of the wiring layer 17. The solder resist layer 19 includes openings 19X partially exposing an upper surface 17a of the wiring layer 17 as external connection pads P12. The material of the solder resist layer 19 may be, for example, an insulative resin such as an epoxy resin or an acrylic resin.

As necessary, an OSP process may be performed to form an OSP film on the surface (the upper surface 17a in FIG. 1) of the wiring layer 17 exposed in the openings 19X of the solder resist layer 19. Alternatively, a metal layer may be formed on the upper surface 17a of the wiring layer 17 exposed in the openings 19X. Examples of the metal layer include an Au layer, an Ni layer/Au layer (metal layer in which an Ni layer serves as the bottom layer, and an Au layer is formed on the Ni layer), and an Ni layer/Pd layer/Au layer (metal layer in which an Ni layer serves as the bottom layer, and the Ni layer, a Pd layer, and an Au layer are stacked in this order). The OSP film or the metal layer formed on the upper surface 17a of the wiring layer 17 exposed in the openings 19X may be used as the external connection pads P12.

FIG. 2 is an enlarged cross-sectional view of a portion of the insulation layer 12 and the wiring layer 13 of the wiring substrate 10. As described above, the insulation layer 12 includes the insulation layer 21 and the insulation layer 22.

The insulation layer 21 covers a portion of the upper surface 11a of the wiring layer 11 and side surfaces 11c of the wiring layer 11. The insulation layer 21 includes openings 21X exposing a partial region of the upper surface 11a of the wiring layer 11.

The insulation layer 21 is an insulative resin layer including the reinforcement material 21G. The reinforcement material 21G is, for example, a glass cloth (glass woven cloth). The reinforcement material 21G has ends 21Ge projecting in the openings 21X from the wall surfaces of the openings 21X.

The reinforcement material 21G includes, for example, fiber bundles G1 arranged next to one another in an X direction (sideward direction in FIG. 2) and fiber bundles G2 arranged next to one another in a Y direction (direction orthogonal to the plane of FIG. 2). The reinforcement material 21G has the form of plain weave in which the fiber bundles G1 and the fiber bundles G2 are woven in, for example, a lattice arrangement. Each of the fiber bundles G1 and G2 is a bundle of fibers having diameters of, for example, approximately 3 to 10 μm. The thickness of the reinforcement material 21G including the fiber bundles G1 and G2 may be, for example, 10 to 30 μm. The entire cross-sectional shape of each of the fiber bundles G1 and G2 is not particularly limited and may be, for example, an ellipse or a circle. The reinforcement material 21G is not limited to a glass cloth (glass woven cloth) and may be a woven cloth or a non-woven cloth formed by carbon fibers, polyester fibers, nylon fibers, aramid fibers, or liquid crystal polymer fibers. The weave pattern of the fiber bundles G1 and G2 is not limited to plain weave and may be satin weave or twill weave. The above description of the reinforcement material 21G also applies to reinforcement materials 31G and 41G.

The insulation layer 22 covers an upper surface 21a of the insulation layer 21, the wall surfaces of the openings 21X in the insulation layer 21, and a peripheral part (first part) of the partial region of the upper surface 11a of the wiring layer 11 exposed in each opening 21X. The insulation layer 22 includes openings 22X exposing a central part (second part) of the partial region of the upper surface 11a of the wiring layer 11 in each opening 21X. The openings 22X correspond to the openings 12X in the insulation layer 12 illustrated in FIG. 1. Thus, the openings 22X may also be referred to as via holes.

In the example illustrated in FIG. 2, the insulation layer 22 includes an upper surface covering portion H1 and a wall surface covering portion H2. The upper surface covering portion H1 covers the upper surface 21a of the insulation layer 21. The wall surface covering portion H2 covers the wall surface of the opening 21X in the insulation layer 21 and the peripheral part of the partial region of the upper surface 11a of the wiring layer 11 exposed in the opening 21X. The opening 22X (via hole) is a through hole defined by the wall surface covering portion H2 and exposes the central part of the partial region of the upper surface 11a of the wiring layer 11 exposed in the opening 21X. The wall surface covering portion H2 covers the entire surface of the reinforcement material 21G projecting from the wall surface of the opening 21X in the insulation layer 21. Thus, the reinforcement material 21G does not project in the opening 22X of the insulation layer 22.

The wall surface of the opening 21X in the insulation layer 21 has a smaller inclination angle than the wall surface of the opening 22X in the insulation layer 22. In this specification, the inclination angle refers to an angle formed by the upper surface 11a of the wiring layer 11 and the wall surface of each of the openings 21X and 22X. The wall surface covering portion H2 has a greater thickness than the upper surface covering portion H1 at a position close to the upper surface 21a of the insulation layer 21.

The reinforcement material 21G is located in the center of the insulation layer 12 in the thickness-wise direction (total thickness T0). The total thickness T0 of the insulation layer 12 is a thickness from the upper surface 11a of the wiring layer 11 to the upper surface 12a of the insulation layer 12 (upper surface 22a of insulation layer 22). Thus, a thickness T1 from the reinforcement material 21G to the upper surface 11a of the wiring layer 11 is equal to a thickness T2 from the reinforcement material 21G to the upper surface 12a of the insulation layer 12 (upper surface 22a of insulation layer 22). As described above, the insulation layer 12 includes the insulation layer 21, which includes the reinforcement material 21G, and the insulation layer 22, which is formed on the insulation layer 21 and does not include reinforcement materials. Thus, in the insulation layer 21, the reinforcement material 21G is located in a position higher than the center of the insulation layer 21 in the thickness-wise direction, that is, a position closer to the upper surface 21a of the insulation layer 21.

The total thickness T0 of the insulation layer 12 is, for example, 30 to 100 μm. The thickness of the wiring layer 11 may be, for example, 15 to 35 μm. The thickness of the insulation layer 21 may be, for example, approximately 30 to 50 μm. The thickness of the insulation layer 22 may be, for example, approximately 10 to 20 μm. For example, when the total thickness T0 of the insulation layer 12 is 40 μm, the thickness of the insulation layer 21 (thickness from the upper surface 11a of the wiring layer 11 to the upper surface 21a of the insulation layer 21) may be, for example, 30 μm, and the thickness of the insulation layer 22 (thickness of the upper surface covering portion H1) may be, for example, 10 μm.

A material that demonstrates satisfactory adhesion between the wiring layer 13 and the insulation layer 22 may be used as the material of the insulation layer 22. The wiring layer 13 includes a seed layer 13A and a metal layer 13B. For example, electroless copper may be used as the seed layer 13A. From this viewpoint, an insulative resin that demonstrates satisfactory adhesion between the insulation layer 22 and electroless copper (seed layer 13A) may be used as the insulative resin of the insulation layer 22. For example, the insulative resin of the insulation layer 22 may have a greater adhesion to the seed layer 13A than the insulative resin of the insulation layer 21. The material of the insulation layer 22 may be the same as the material of the insulative resin of the insulation layer 21.

In the wiring layer 13, the seed layer 13A is formed on the upper surface 22a of the insulation layer 22, the wall surfaces of the openings 22X, and the upper surface 11a of the wiring layer 11 exposed in the openings 22X. The material of the seed layer 13A may be, for example, Cu or an alloy of Cu. Alternatively, the material of the seed layer 13A may be, for example, titanium (Ti), titanium nitride (TiN), tantalum nitride (TaN), tantalum (Ta), or chromium (Cr). The metal layer 13B is formed on the seed layer 13A. The material of the metal layer 13B may be, for example, Cu or an alloy of Cu.

Steps of manufacturing the wiring substrate 10 will now be described. Steps of manufacturing a structure that is illustrated in FIG. 2 and included in the wiring substrate 10 will be described. For the sake of brevity, a portion that ultimately becomes a component of the wiring substrate 10 is indicated by the reference character used to denote the final component.

Figure 3A:
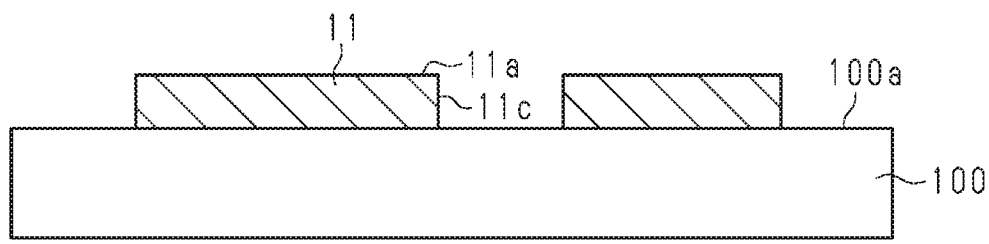
FIGS. 3A to 3C, 4A to 4C, and 5A to 5C are schematic cross-sectional views illustrating the steps of manufacturing the wiring substrate illustrated in FIG. 1.

In the step illustrated in FIG. 3A, the wiring layer 11 is formed on an upper surface 100a of a support 100. For example, a metal plate or a metal foil may be used as the support 100. For example, a resist layer (not illustrated) is formed on the upper surface 100a of the support 100. The resist layer includes openings located in portions where the wiring layer 11 is formed. For example, a dry film resist may be used as the resist layer. The wiring layer 11 may be formed, for example, by using the support 100 as a power feeding electrode and performing electrolytic plating on the upper surface 100a exposed in the openings of the resist layer. Alternatively, the wiring layer 11 may be formed by forming a seed layer on the upper surface 100a of the support 100 via an insulation layer and using the seed layer as a power feeding electrode.

Figure 3B:
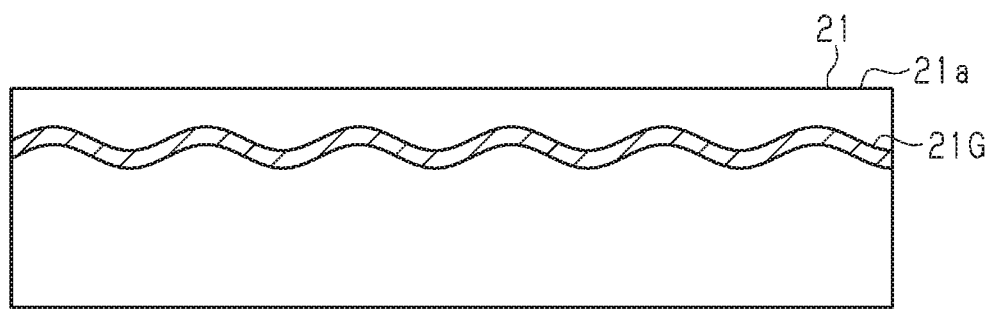

In the step illustrated in FIG. 3B, the insulation layer 21 is prepared. The insulation layer 21 is a pre-preg in which the reinforcement material 21G is impregnated with an insulative resin. The reinforcement material 21G is located at a position closer to the upper surface 21a of the insulation layer 21.

Figure 3C:
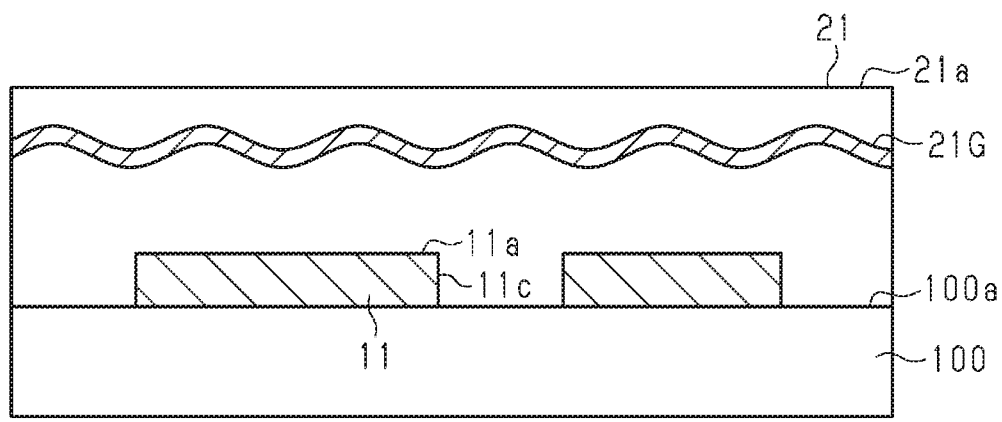

In the step illustrated in FIG. 3C, the insulation layer 21 is formed on the upper surface 100a of the support 100 to cover the upper surface 11a and the side surfaces 11c of the wiring layer 11. Since the reinforcement material 21G is located at a position closer to the upper surface 21a of the insulation layer 21, the insulative resin of the insulation layer 21 may be embedded between wiring patterns of the wiring layer 11. The insulation layer 21 is heated to a given temperature so that the insulation layer 21 is cured. As necessary, the insulation layer 21 may be heated under pressure.

Figure 4A:
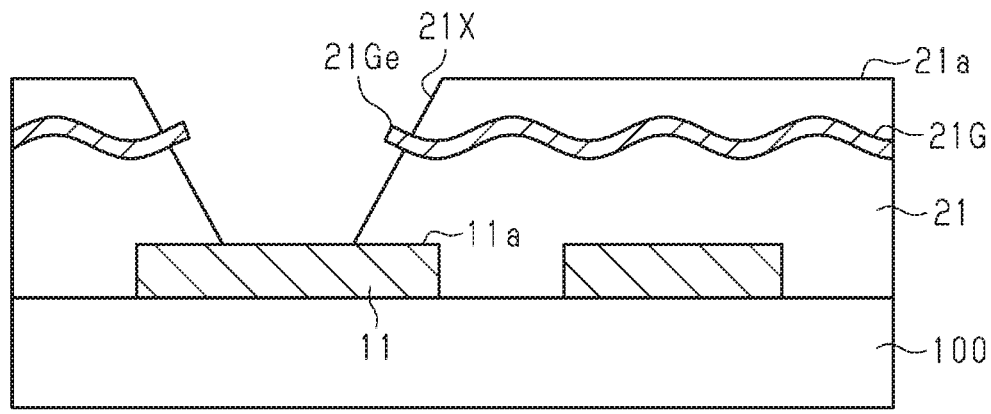

In the step illustrated in FIG. 4A, the opening 21X is formed in the insulation layer 21 to expose a partial region of the upper surface 11a of the wiring layer 11. The opening 21X may be formed by laser drilling by irradiating the insulation layer 21 with laser beams. The source of laser beams used in the laser beam irradiation may be, for example, a $CO_2$ laser or a YAG laser. During the laser drilling, for example, the shape of laser beams and the time of laser drilling are adjusted so that the opening 21X has the form of an inverted truncated cone, the diameter (open width) of which decreases from the upper surface 21a toward the wiring layer 11. The opening 21X is formed so that the open diameter at the upper surface 11a of the wiring layer 11 is greater than the bottom diameter of a via portion 13V illustrated in FIG. 2. As necessary, a desmear process may be performed after the laser drilling. During the laser drilling, the ends 21Ge of the reinforcement material 21G project in the opening 21X from the wall surface of the opening 21X due to the difference in processing property (e.g., difference in sublimation temperature) between the insulative resin of the insulation layer 21 and the reinforcement material 21G.

Figure 4B:
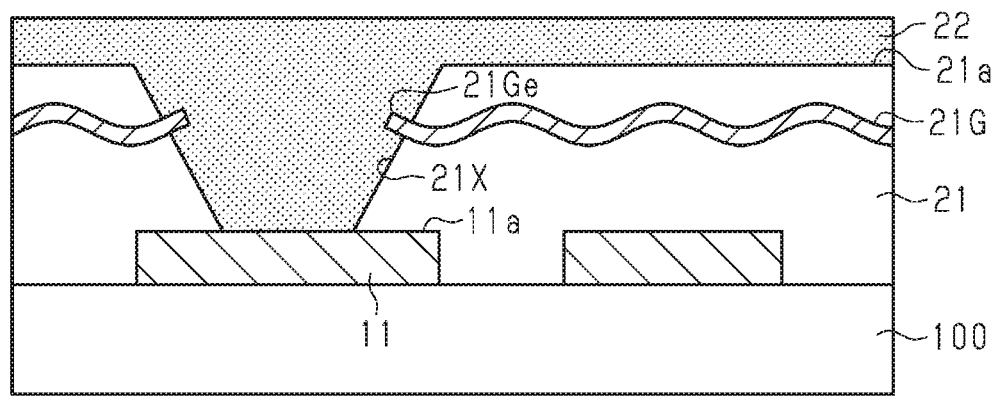

In the step illustrated in FIG. 4B, the insulation layer 22 is formed from an insulative resin that does not include reinforcement materials. The insulation layer 22 covers the insulation layer 21 and fills the opening 21X in the insulation layer 21. For example, a thermosetting insulative epoxy resin may be heated and cured to form the insulation layer 22.

Figure 4C:
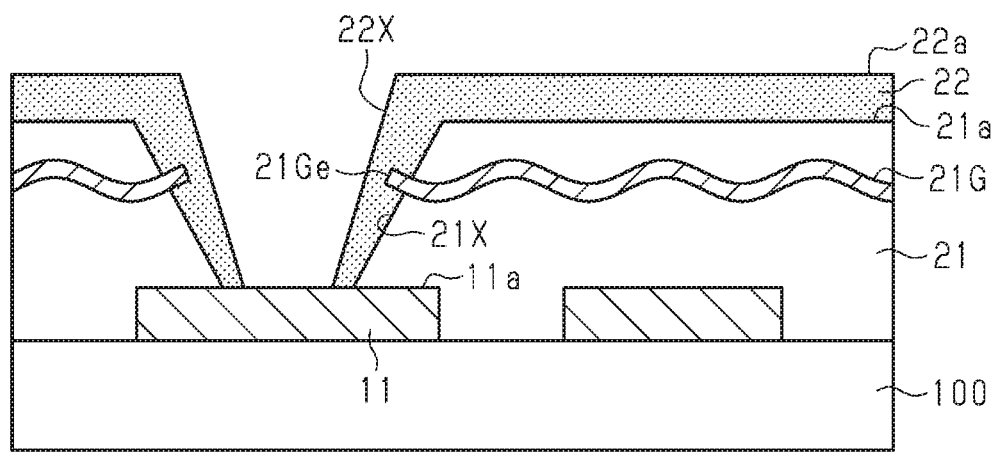

In the step illustrated in FIG. 4C, the opening 22X is formed in the insulation layer 22. The opening 22X is formed by irradiating the insulation layer 22 with laser beams. The source of laser beams used in the laser beam irradiation may be, for example, a $CO_2$ layer or a YAG laser. The laser beam irradiation forms the opening 22X having a desired shape. In the present example, the opening 22X exposes a central part of the partial region of the upper surface 11a of the wiring layer 11 in the opening 21X.

Figure 5A:
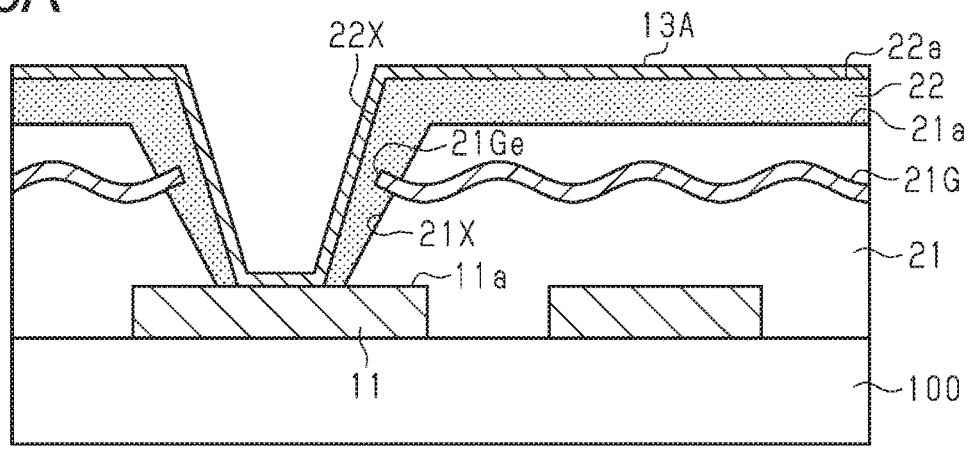

In the step illustrated in FIG. 5A, the surface of the insulation layer 22 is covered with the seed layer 13A. The seed layer 13A may be formed, for example, by electroless plating (in the present example, electroless copper plating) or sputtering. The material of the seed layer 13A may be, for example, Cu or an alloy of Cu.

Figure 5B:
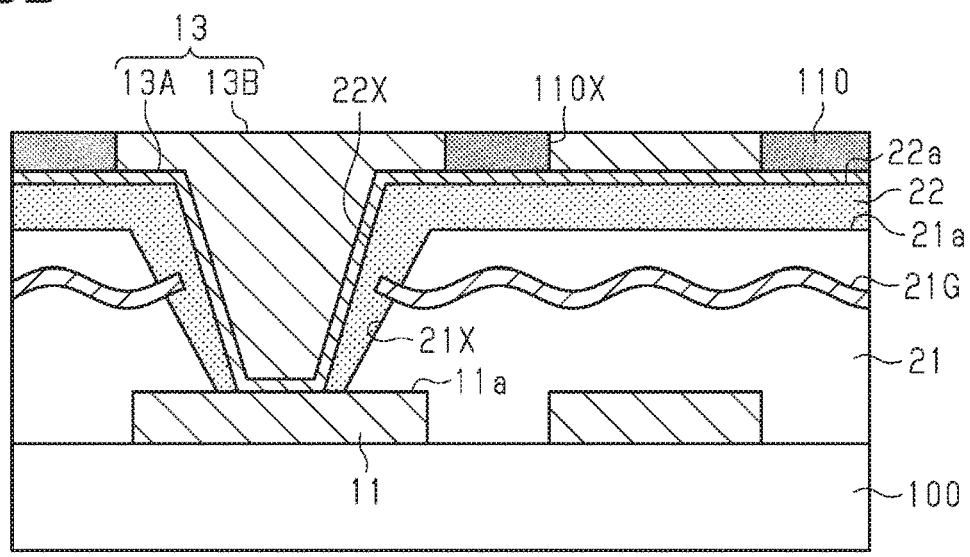

In the step illustrated in FIG. 5B, a resist layer 110 is formed. The resist layer 110 includes an opening 110X located in a portion where the wiring layer 13 is formed. The material of the resist layer 110 may have resistance to plating that is performed in the next step.

Next, for example, electrolytic plating (in the present example, electrolytic copper plating) that uses the seed layer 13A as a power feeding electrode is performed so that a plating metal deposits and develops on the seed layer 13A exposed in the opening 110X of the resist layer 110 to form the metal layer 13B.

Figure 5C:
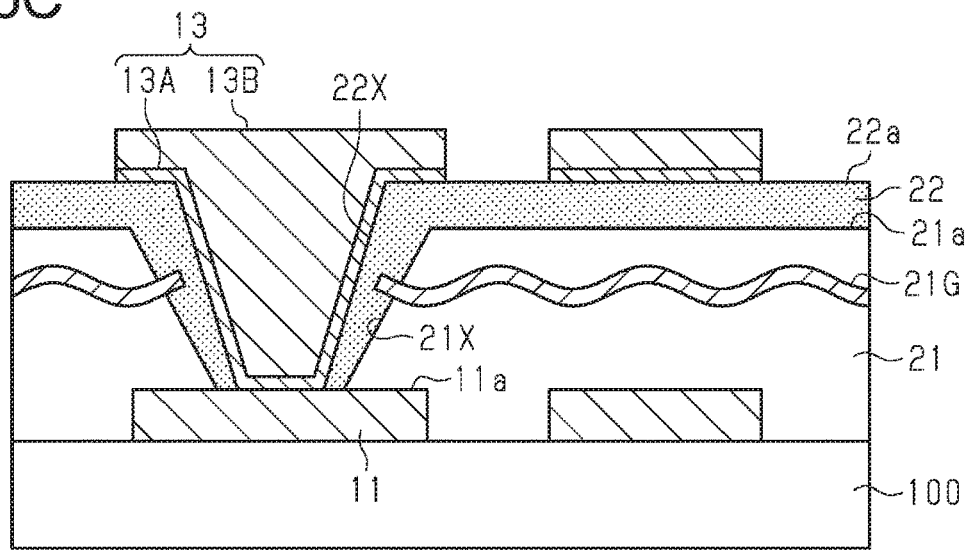

In the step illustrated in FIG. 5C, the resist layer 110 illustrated in FIG. 5B is removed. Additionally, the seed layer 13A exposed from the metal layer 13B, that is, a portion of the seed layer 13A not present in the final device, is removed. The resist layer 110 may be removed, for example, by ashing or using an alkaline stripping solution. The seed layer 13A is removed, for example, by etching. This forms the wiring layer 13 that includes the via portions 13V and the wiring portions 13P (refer to FIG. 2).

The steps of forming the insulation layer 12 and the wiring layer 13 illustrated in FIG. 2 have been described. The remaining insulation layers 14 and 16 and wiring layers 15 and 17 illustrated in FIG. 1 are formed by the same steps as those described above with reference to the insulation layer 12 and the wiring layer 13. The insulation layer 14 is formed on the upper surface 12a of the insulation layer 12 instead of the support 100. The insulation layer 16 is formed on the upper surface 14a of the insulation layer 14.

The wiring substrate 10 has the advantages described below.

(1-1) The insulation layer 12 includes the insulation layer 21, which includes the reinforcement material 21G, and the insulation layer 22, which does not include reinforcement materials. The insulation layer 21 includes the openings 21X exposing the partial region of the upper surface 11a of the wiring layer 11. The insulation layer 22 covers the upper surface 21a of the insulation layer 21, the wall surfaces of the openings 21X, the peripheral part of the partial region of the upper surface 11a of the wiring layer 11 exposed in the openings 21X. The insulation layer 22 entirely covers the ends 21Ge of the reinforcement material 21G projecting in the openings 21X of the insulation layer 21. This properly forms the openings 22X (via holes) and the via portions 13V and limits decreases of the connection reliability of the wiring substrate 10.

For example, if the ends 21Ge of the reinforcement material 21G project in the openings 22X, the difference in sublimation speed between the insulative resin and the reinforcement material 21G (e.g., glass cloth) may cause variations in the diameter of the openings 22X. Decreases in the diameter of an opening 22X decrease the open diameter that exposes the upper surface 11a of the wiring layer 11 and reduces the area of contact between the wiring layer 11 and the via portion 13V, decreasing the connection reliability.

In this regard, in the wiring substrate 10 of the present embodiment, the upper surface 21a of the insulation layer 21 and the wall surfaces of the openings 21X, which include the reinforcement material 21G, are covered with the insulation layer 22, which does not include reinforcement materials. The insulation layer 22 covers the entire surface of the reinforcement material 21G projecting in the openings 21X. The openings 22X are formed in the insulation layer 22, and the reinforcement material 21G does not project in the openings 22X. This limits variations in the diameter of the openings 22X in the insulation layer 22 and obtains a satisfactory area of contact between the wiring layer 11 and the via portions 13V. Thus, decreases in the connection reliability are limited.

(1-2) If the ends 21Ge of the reinforcement material 21G project in the openings 22X, the wall surfaces of the openings 22X may have steps, which hinder a plating metal from filling the openings 22X when forming the via portions 13V of the wiring layer 13. As a result, voids may be formed in the plating metal (via portions 13V). Additionally, if the ends 21Ge of the reinforcement material 21G project in the openings 22X and the seed layer 13A is formed, the seed layer 13A may close the openings 22X at the ends 21Ge of the reinforcement material 21G, or filling of the plating metal may be insufficient in the vicinity of the ends 21Ge. As a result, voids may be formed in the plating metal (via portions 13V) in the vicinity of the upper surface 11a of the wiring layer 11. The voids decrease the connection reliability of the wiring layer 11 and the via portions 13V.

In this regard, in the wiring substrate 10 of the present embodiment, the insulation layer 22, which does not include reinforcement materials, covers the entire surface of the reinforcement material 21G projecting in the openings 21X. The openings 22X are formed in the insulation layer 22. Thus, in the present embodiment, the wall surfaces of the openings 22X do not have steps, and the plating metal (via portions 13V) sufficiently fills the openings 22X and limits formation of voids. Additionally, the seed layer 13A is formed on the entire wall surface of the openings 22X. This also limits formation of voids in the plating metal (via portions 13V) filling the openings 22X (via holes). Thus, decreases in the connection reliability between the wiring layer 11 and the via portions 13V are limited.

(1-3) For example, if the via portions 13V of the wiring layer 13 contact the reinforcement material 21G, migration that forms conductive anodic filament (CAF) may occur along the reinforcement material 21G. For example, when a glass cloth is used as the reinforcement material 21G, migration may occur along fibers of the glass cloth, and adjacent vias may short.

In this regard, in the wiring substrate 10 of the present embodiment, the insulation layer 22 covers the entire surface of the reinforcement material 21G projecting in the openings 21X, and the via portions 13V of the wiring layer 13 do not contact the reinforcement material 21G. This limits occurrence of migration and increases the insulation reliability of the wiring substrate 10.

(1-4) The openings 21X in the insulation layer 21 have the form of an inverted truncated cone, the diameter (open width) of which decreases from the upper surface 21a of the insulation layer 21 toward the upper surface 11a of the wiring layer 11. Thus, at the upper end of each opening 21X, the angle formed by the upper surface 21a of the insulation layer 21 and the wall surface of the opening 21X is greater than the right angle, that is, obtuse. This reduces stress applied to the insulation layer 22, which covers the upper surface 21a of the insulation layer 21 and the wall surface of the opening 21X, at the upper end of the opening 21X.

(1-5) In the same manner, the openings 22X in the insulation layer 22 have the form of an inverted truncated cone, the diameter (open width) of which decreases from the upper surface 22a of the insulation layer 22 toward the upper surface 11a of the wiring layer 11. Thus, at the upper end of each opening 22X, the angle formed by the upper surface 22a of the insulation layer 22 and the wall surface of the opening 22X is greater than the right angle, that is, obtuse. This reduces stress applied to the wiring layer 13, which includes the wiring portions 13P formed on the upper surface 22a of the insulation layer 22 and the via portions 13V formed in the openings 22X, at the upper end of the opening 22X.

(1-6) As described above, the openings 21X of the insulation layer 21 have the form of an inverted truncated cone, the diameter of which decreases from the upper surface 21a of the insulation layer 21 toward the upper surface 11a of the wiring layer 11. Thus, the pre-preg of the insulative resin forming the insulation layer 22 readily fills the openings 21X in the insulation layer 21.

(1-7) The insulation layer 22 covers the upper surface 21a of the insulation layer 21 and the wall surfaces of the openings 21X. The wiring layer 13 includes the wiring portions 13P, which are formed on the upper surface 22a of the insulation layer 22, and the via portions 13V, which are formed in the openings 22X of the insulation layer 22. Thus, for example, a desmear process that obtains an entirely uniform surface (the upper surface 22a and wall surfaces of the openings 22X) of the insulation layer 22 is performed to obtain a uniform surface roughness of the insulation layer 22. Thus, the insulation layer 22 uniformly adheres to the seed layer 13A (wiring layer 13).

(1-8) The reinforcement material 21G is located in the center of the insulation layer 12 in the thickness-wise direction (the total thickness T0). Thus, a balance is maintained between an upper resin layer of the insulation layer 12 (thickness T2) extending from the reinforcement material 21G to the upper surface 12a of the insulation layer 12 and a lower resin layer of the insulation layer 12 (thickness T2) extending from the reinforcement material 21G to the upper surface 11a of the wiring layer 11. This limits occurrence of bending and undulation of the wiring substrate 10.

(1-9) A material that demonstrates satisfactory adhesion between the insulation layer 22 and the wiring layer 13 may be used as the material of the insulation layer 22. For example, the insulative resin of the insulation layer 22 has a greater adhesion to the seed layer 13A than the insulative resin of the insulation layer 21. A material that demonstrates satisfactory adhesion between the insulative resin of the insulation layer 21 and the reinforcement material 21G may be used as the insulative resin of the insulation layer 21. In this manner, any properties of the insulation layer 21 and the insulation layer 22 may be set. This increases the degree of freedom in design.

(1-10) The reinforcement material 21G is located at a position closer to the upper surface 21a of the insulation layer 21. Thus, the lower resin layer of the insulation layer 21 located below the reinforcement material 21G is thicker than the upper resin layer of the insulation layer 21 located above the reinforcement material 21G. This allows an insulative resin to be properly embedded between wiring patterns of the wiring layer 11. Ultimately, the wiring layer 11 is properly embedded in the insulation layer 21.

Second Embodiment

A second embodiment of a wiring substrate 200 will now be described. In the second embodiment, the same reference characters are given to those elements that are the same as the corresponding elements of the first embodiment. Such elements may not be described in detail.

Figure 6:
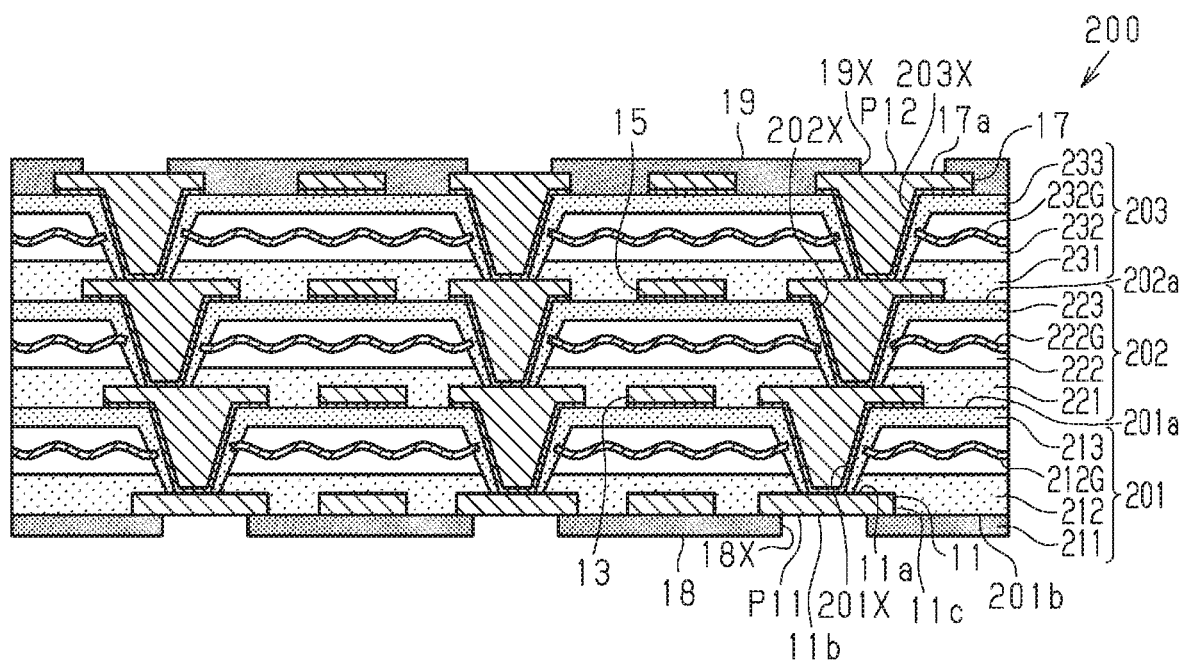
FIG. 6 is a schematic cross-sectional view illustrating a second embodiment of a wiring substrate.

As illustrated in FIG. 6, the wiring substrate 200 includes the wiring layers 11, 13, 15, and 17, insulation layers 201, 202, and 203, and the solder resist layers 18 and 19.

The insulation layer 201 covers a portion of the upper surface 11a and the side surfaces 11c of the wiring layer 11. The insulation layer 201 includes openings 201X partially exposing the upper surface 11a of the wiring layer 11. The openings 201X may also be referred to as via holes. The insulation layer 201 has a lower surface 201b that is substantially flush with the lower surface 11b of the wiring layer 11.

The insulation layer 201 includes an insulation layer 211 that does not include reinforcement materials, an insulation layer 212 that includes a reinforcement material 212G, and an insulation layer 213 that does not include reinforcement materials.

The insulative resin of the insulation layer 211 may be, for example, an epoxy resin, an imide resin, a phenol resin, or a cyanate resin. The insulative resin of the insulation layer 211 may be, for example, a thermosetting resin. The insulation layer 211 may include, for example, a filler such as silica or alumina.

The insulation layer 212 is formed by impregnating the reinforcement material 212G with an insulative resin. The reinforcement material 212G may be, for example, a woven cloth or a nonwoven cloth formed by glass fibers, carbon fibers, or aramid fibers. The insulative resin of the insulation layer 212 may be, for example, an epoxy resin, an imide resin, a phenol resin, or a cyanate resin. The insulative resin of the insulation layer 212 may be, for example, a thermosetting resin. The insulation layer 212 may include, for example, a filler such as silica or alumina.

The insulative resin of the insulation layer 213 may be, for example, an epoxy resin, an imide resin, a phenol resin, or a cyanate resin. The insulative resin of the insulation layer 213 may be, for example, a thermosetting resin. The insulation layer 213 may include, for example, a filler such as silica or alumina.

The insulation layer 202 is formed on an upper surface 201a of the insulation layer 201. The insulation layer 202 covers the upper surface 201a of the insulation layer 201 and a portion of the wiring layer 13. The insulation layer 202 includes openings 202X partially exposing the upper surface of the wiring layer 13. The openings 202X may also be referred to as via holes.

The insulation layer 202 includes an insulation layer 221 that does not include reinforcement materials, an insulation layer 222 that includes a reinforcement material 222G, and an insulation layer 223 that does not include reinforcement materials.

The insulative resin of the insulation layer 221 may be, for example, an epoxy resin, an imide resin, a phenol resin, or a cyanate resin. The insulative resin of the insulation layer 221 may be, for example, a thermosetting resin. The insulation layer 221 may include, for example, a filler such as silica or alumina.

The insulation layer 222 is formed by impregnating the reinforcement material 222G with an insulative resin. The reinforcement material 222G may be, for example, a woven cloth or a nonwoven cloth formed by glass fibers, carbon fibers, or aramid fibers. The insulative resin of the insulation layer 222 may be, for example, an epoxy resin, an imide resin, a phenol resin, or a cyanate resin. The insulative resin of the insulation layer 222 may be, for example, a thermosetting resin. The insulation layer 222 may include, for example, a filler such as silica or alumina.

The insulative resin of the insulation layer 223 may be, for example, an epoxy resin, an imide resin, a phenol resin, or a cyanate resin. The insulative resin of the insulation layer 223 may be, for example, a thermosetting resin. The insulation layer 223 may include, for example, a filler such as silica or alumina.

The insulation layer 203 is formed on an upper surface 202a of the insulation layer 202. The insulation layer 203 covers the upper surface 202a of the insulation layer 202 and a portion of the wiring layer 15. The insulation layer 203 includes openings 203X partially exposing the upper surface of the wiring layer 15. The openings 203X may also be referred to as via holes.

The insulation layer 203 includes an insulation layer 231 that does not include reinforcement materials, an insulation layer 232 that includes a reinforcement material 232G, and an insulation layer 233 that does not include reinforcement materials.

The insulative resin of the insulation layer 231 may be, for example, an epoxy resin, an imide resin, a phenol resin, or a cyanate resin. The insulative resin of the insulation layer 231 may be, for example, a thermosetting resin. The insulation layer 231 may include, for example, a filler such as silica or alumina.

The insulation layer 232 is formed by impregnating a reinforcement material 232G with an insulative resin. The reinforcement material 232G may be, for example, a woven cloth or a nonwoven cloth formed by glass fibers, carbon fibers, or aramid fibers. The insulative resin of the insulation layer 232 may be, for example, an epoxy resin, an imide resin, a phenol resin, or a cyanate resin. The insulative resin of the insulation layer 232 may be, for example, a thermosetting resin. The insulation layer 232 may include, for example, a filler such as silica or alumina.

The insulative resin of the insulation layer 233 may be, for example, an epoxy resin, an imide resin, a phenol resin, or a cyanate resin. The insulative resin of the insulation layer 233 may be, for example, a thermosetting resin. The insulation layer 233 may include, for example, a filler such as silica or alumina.

Figure 7:
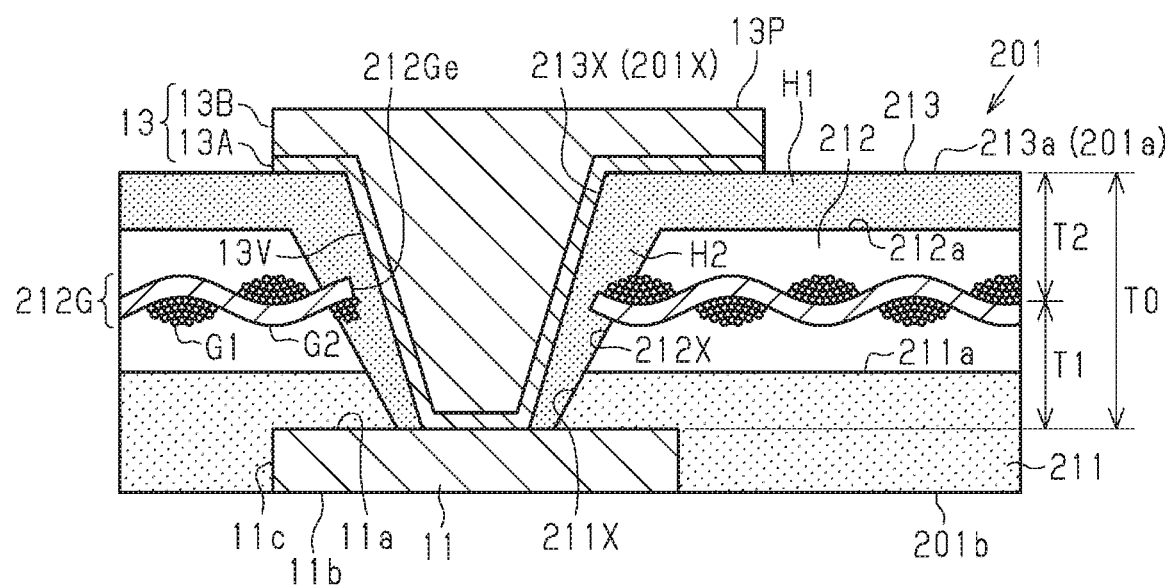
FIG. 7 is an enlarged cross-sectional view illustrating a portion of the wiring substrate illustrated in FIG. 6.

FIG. 7 is an enlarged cross-sectional view illustrating a portion of the insulation layer 201 and the wiring layer 13 of the wiring substrate 200. As described above, the insulation layer 201 includes the insulation layers 211, 212, and 213.

The insulation layer 211 covers a portion of the upper surface 11a and the side surfaces 11c of the wiring layer 11. The insulation layer 211 includes openings 211X partially exposing the upper surface 11a of the wiring layer 11. The thickness of the wiring layer 11 may be, for example, 15 to 35 µm.

The insulation layer 211 is formed from only an insulative resin. In the present example, the insulation layer 211 does not include reinforcement materials. However, the insulation layer 211 may include an additive such as a filler. Such a filler is, for example, silica or alumina. The material of the insulation layer 211 may be an insulative resin that demonstrates satisfactory adhesion between the insulation layer 211 and the wiring layer 11. Such an insulative resin may be, for example, an epoxy resin, an imide resin, a phenol resin, or a cyanate resin. The insulative resin of the insulation layer 211 may be, for example, a thermosetting resin. The thickness of the insulation layer 211 from the upper surface of the wiring layer 11 to an upper surface 211a of the insulation layer 211 may be, for example, approximately 10 µm.

The insulation layer 212 covers the upper surface of the insulation layer 211. The insulation layer 212 includes openings 212X partially exposing the upper surface 11a of the wiring layer 11. The openings 212X in the insulation layer 212 are continuous with the openings 211X in the insulation layer 211.

The insulation layer 212 is an insulative resin layer including the reinforcement material 212G. The reinforcement material 212G is, for example, a glass cloth (glass woven cloth). The reinforcement material 21G has ends 212Ge projecting in the opening 212X from the wall surface of the opening 212X.

The reinforcement material 212G includes, for example, fiber bundles G1 arranged next to one another in the X direction (sideward direction in FIG. 7) and fiber bundles G2 arranged next to one another in the Y direction (direction orthogonal to the plane of FIG. 7). The reinforcement material 212G has the form of plain weave in which the fiber bundles G1 and the fiber bundles G2 are woven in, for example, a lattice arrangement. Each of the fiber bundles G1 and G2 is formed by fibers. The entire cross-sectional shape of each of the fiber bundles G1 and G2 is not particularly limited and may be, for example, an ellipse or a circle.

The reinforcement material 212G is not limited to a glass cloth (glass woven cloth) and may be a woven cloth or a non-woven cloth formed by carbon fibers, polyester fibers, nylon fibers, aramid fibers, or liquid crystal polymer fibers. The weave pattern of the fiber bundles G1 and G2 is not limited to plain weave and may be satin weave or twill weave. The above description of the reinforcement material 212G also applies to the reinforcement materials 222G and 232G.

The insulative resin of the insulation layer 212 may be, for example, a material that demonstrates satisfactory adhesion between the insulative resin of the insulation layer 212 and the reinforcement material 212G. Such an insulative resin may be, for example, an epoxy resin, an imide resin, a phenol resin, or a cyanate resin. The insulative resin of the insulation layer 212 may be, for example, a thermosetting resin. The thickness of the insulation layer 212 may be, for example, approximately 20 to 50 µm. The insulation layer 212 may include a filler such as silica or alumina.

The insulation layer 213 covers an upper surface 212a of the insulation layer 212, the wall surfaces of the openings 212X in the insulation layer 212, the wall surfaces of the openings 211X in the insulation layer 211, and a peripheral part (first part) of a partial region of the upper surface 11a of the wiring layer 11 exposed in the openings 211X. The insulation layer 213 includes openings 213X exposing a central part (second part) of the partial region of the upper surface 11a of the wiring layer 11 in the openings 211X. The openings 213X correspond to the openings 201X in the insulation layer 201 illustrated in FIG. 6. Thus, the openings 213X may also be referred to as via holes.

In the example illustrated in FIG. 7, the insulation layer 213 includes the upper surface covering portion H1 and the wall surface covering portion H2. The upper surface covering portion H1 covers the upper surface 212a of the insulation layer 212. The wall surface covering portion H2 covers the wall surface of the opening 212X in the insulation layer 212, the wall surface of the opening 211X in the insulation layer 211, and the peripheral part of the partial region of the upper surface 11a of the wiring layer 11 exposed in the opening 211X. The opening 213X (via hole) is a through hole defined by the wall surface covering portion H2 and exposes the central part of the partial region of the upper surface 11a of the wiring layer 11 exposed in the opening 211X. The wall surface covering portion H2 covers the entire surface of the reinforcement material 212G projecting from the wall surface of the opening 212X in the insulation layer 212. Thus, the reinforcement material 212G does not project in the opening 213X of the insulation layer 213.

The opening 211X in the insulation layer 211 is continuous with the opening 212X in the insulation layer 212. Each of the openings 211X and 212X has the form of an inverted truncated cone, the diameter (open width) decreases from the upper surface 212a of the insulation layer 212 toward the wiring layer 11. Thus, the openings 211X and 212X are formed in the same manner as the opening 21X in the insulation layer 21 of the first embodiment. In the same manner, the opening 213X in the insulation layer 213 has the form of an inverted truncated cone, the diameter (open width) of which decreases from an upper surface 213a of the insulation layer 213 toward the upper surface 11a of the wiring layer 11. Thus, the opening 213X is formed in the same manner as the opening 22X in the insulation layer 22 of the first embodiment. The wall surfaces of the openings 211X and 212X have a smaller inclination angle than the wall surface of the opening 213X. The wall surface covering portion H2 has a greater thickness than the upper surface covering portion H1 at a position close to the upper surface 212a of the insulation layer 212.

The reinforcement material 212G is located in the center of the insulation layer 201 in the thickness-wise direction (total thickness T0). The total thickness T0 of the insulation layer 201 is the thickness from the upper surface 11a of the wiring layer 11 to the upper surface 213a of the insulation layer 213. Thus, the thickness T1 from the reinforcement material 212G to the upper surface 11a of the wiring layer 11 is equal to the thickness T2 from the reinforcement material 212G to the upper surface 201a of the insulation layer 201 (upper surface 213a of insulation layer 213). The reinforcement material 212G is located in the center of the insulation layer 212 in the thickness-wise direction. The total thickness T0 of the insulation layer 201 is, for example, 30 to 100 µm. For example, when the total thickness T0 of the insulation layer 201 is 40 μm, the thickness of the insulation layer 211 (thickness from upper surface 11a of wiring layer 11 to upper surface 211a of insulation layer 211) may be, for example, 10 μm, the thickness of the insulation layer 212 may be, for example, 20 μm, and the thickness of the insulation layer 213 may be 10 μm.

The material of the insulation layer 213 may be a material that demonstrates satisfactory adhesion between the insulation layer 213 and the wiring layer 13. The wiring layer 13 includes the seed layer 13A and the metal layer 13B. For example, electroless copper is used as the seed layer 13A. From this viewpoint, an insulative resin that demonstrates satisfactory adhesion between the insulation layer 213 and electroless copper (seed layer 13A) may be used as the insulative resin of the insulation layer 213. For example, the insulative resin of the insulation layer 213 may have a greater adhesion to the seed layer 13A than the insulative resin of the insulation layer 212.

In the wiring layer 13, the seed layer 13A is formed on the upper surface 213a of the insulation layer 213, the wall surfaces of the openings 213X, and the upper surface 11a of the wiring layer 11 exposed in the openings 213X. The material of the seed layer 13A may be, for example, Cu or an alloy of Cu. Alternatively, the material of the seed layer 13A may be, for example, titanium (Ti), titanium nitride (TiN), tantalum nitride (TaN), tantalum (Ta), or chromium (Cr). The metal layer 13B is formed on the seed layer 13A. The material of the metal layer 13B may be, for example, Cu or an alloy of Cu.

Steps of manufacturing the wiring substrate 200 will now be described. Steps of manufacturing a structure that is illustrated in FIG. 7 and included in the wiring substrate 200 will be described. For the sake of brevity, a portion that ultimately becomes a component of the wiring substrate 200 is indicated by the reference character used to denote the final component.

Figure 8A:
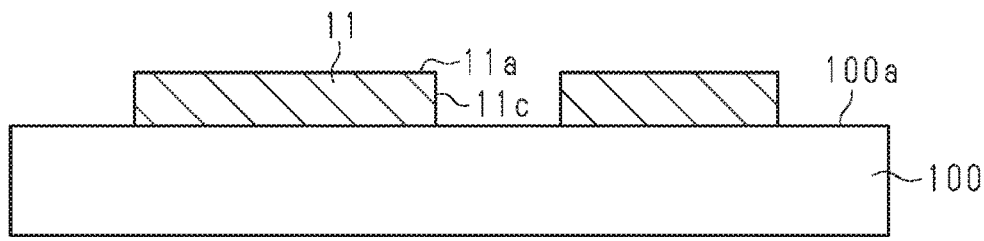
FIGS. 8A to 8D, 9A to 9C, and 10A to 10C are schematic cross-sectional views illustrating the steps of manufacturing the wiring substrate illustrated in FIG. 6.

In the step illustrated in FIG. 8A, the wiring layer 11 is formed on the upper surface 100a of the support 100, for example, through the step illustrated in FIG. 3A.

Figure 8B:
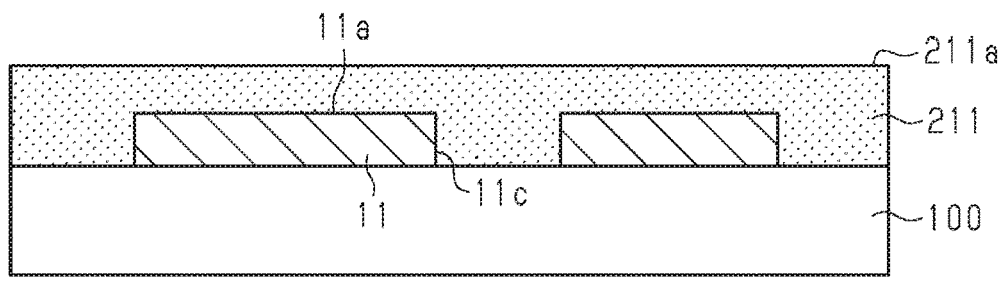

In the step illustrated in FIG. 8B, the insulation layer 211 is formed to cover the upper surface 100a of the support 100 and the upper surface 11a and the side surfaces 11c of the wiring layer 11. The insulation layer 211 is, for example, a thermosetting insulative epoxy resin and may be a B-stage (semi-cured) sheet. The insulation layer 211 is formed from only an insulative resin. A resin material that is less viscous than the insulative resin of the insulation layer 212 may be used as the insulative resin of the insulation layer 211. Thus, the insulation layer 211 is sufficiently embedded between wiring patterns of the wiring layer 11 and adheres to the upper surface 11a and the side surfaces 11c of the wiring layer 11.

Figure 8C:
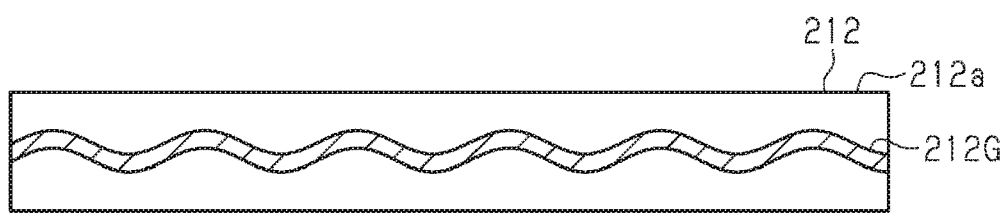

In the step illustrated in FIG. 8C, the insulation layer 212 is prepared. The insulation layer 212 is a pre-preg in which the reinforcement material 212G is impregnated with an insulative resin. The reinforcement material 212G is located in the center of the insulation layer 212 in the thickness-wise direction.

Figure 8D:
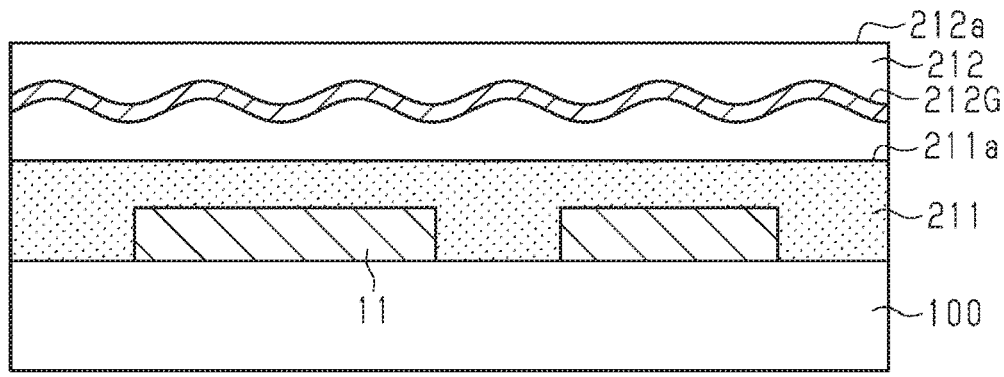

In the step illustrated in FIG. 8D, the insulation layer 212 is formed on the upper surface 211a of the insulation layer 211. The upper surface 211a of the insulation layer 211 is flattened. This allows the insulation layer 212 including the reinforcement material 212G to adhere to the upper surface 211a of the insulation layer 211. The insulation layers 211 and 212 are heated to a given temperature so that the cured insulation layers 211 and 212 are formed. As necessary, the insulation layers 211 and 212 may be heated under pressure.

Figure 9A:
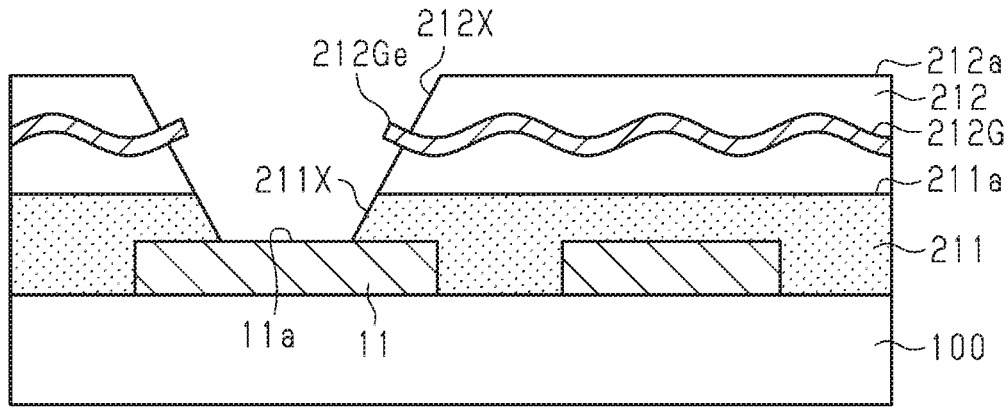

In the step illustrated in FIG. 9A, the openings 211X and 212X are formed in the insulation layers 211 and 212 to expose a partial region of the upper surface 11a of the wiring layer 11. The openings 211X and 212X may be formed by laser drilling by irradiating the insulation layers 211 and 212 with laser beams. The source of laser beams used in the laser beam irradiation may be, for example, a $CO_2$ laser or a YAG laser. During the laser drilling, for example, the shape of laser beams and the time of laser drilling are adjusted so that the openings 211X and 212X have the form of an inverted truncated cone, the diameter of which decreases from the upper surface 212a toward the wiring layer 11. The openings 211X and 212X are formed so that the open diameter at the upper surface 11a of the wiring layer 11 is greater than the bottom diameter of the via portion 13V illustrated in FIG. 7. As necessary, a desmear process may be performed after the laser drilling. During the laser drilling, ends 212Ge of the reinforcement material 212G project in the opening 212X from the wall surface of the opening 212X due to the differences in processing properties (e.g., difference in sublimation temperature) between the insulative resin of the insulation layer 212 and the reinforcement material 212G.

Figure 9B:
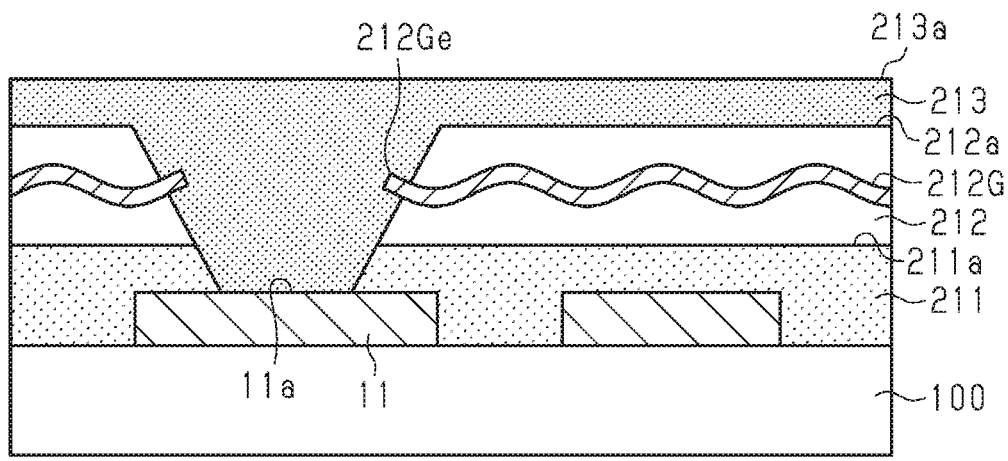

In the step illustrated in FIG. 9B, the insulation layer 213 is formed from an insulative resin that does not include reinforcement materials. The insulation layer 213 covers the insulation layer 212 and fills the openings 211X and 212X in the insulation layers 211 and 212. The insulation layer 213 may be formed, for example, by heating and curing a thermosetting insulative epoxy resin.

Figure 9C:
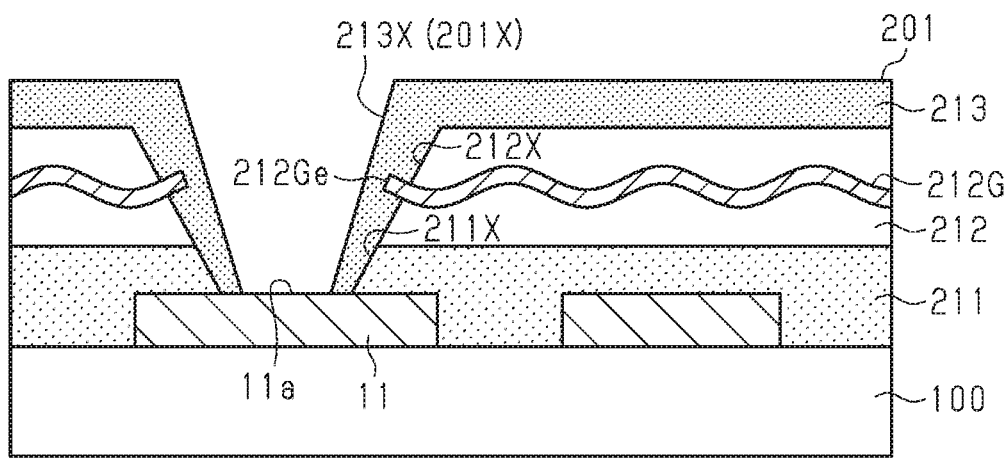

In the step illustrated in FIG. 9C, the opening 213X is formed in the insulation layer 213. The opening 213X is formed by irradiating the insulation layer 213 with laser beams. The source of laser beams used in the laser beam irradiation may be, for example, a $CO_2$ laser or a YAG laser. The laser beam irradiation forms the opening 213X having a desired shape. In the present example, the opening 213X exposes a central part of the partial region of the upper surface 11a of the wiring layer 11 in the opening 211X.

Figure 10A:
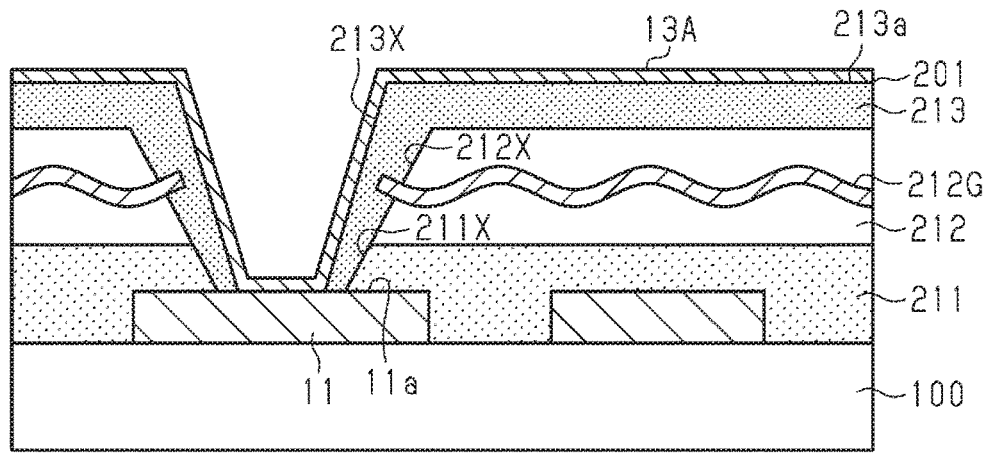

In the step illustrated in FIG. 10A, the seed layer 13A is formed to cover the surface of the insulation layer 213. The seed layer 13A is formed, for example, by electroless plating (in the present example, electroless copper plating). The material of the seed layer 13A may be, for example, Cu or an alloy of Cu.

Figure 10B:
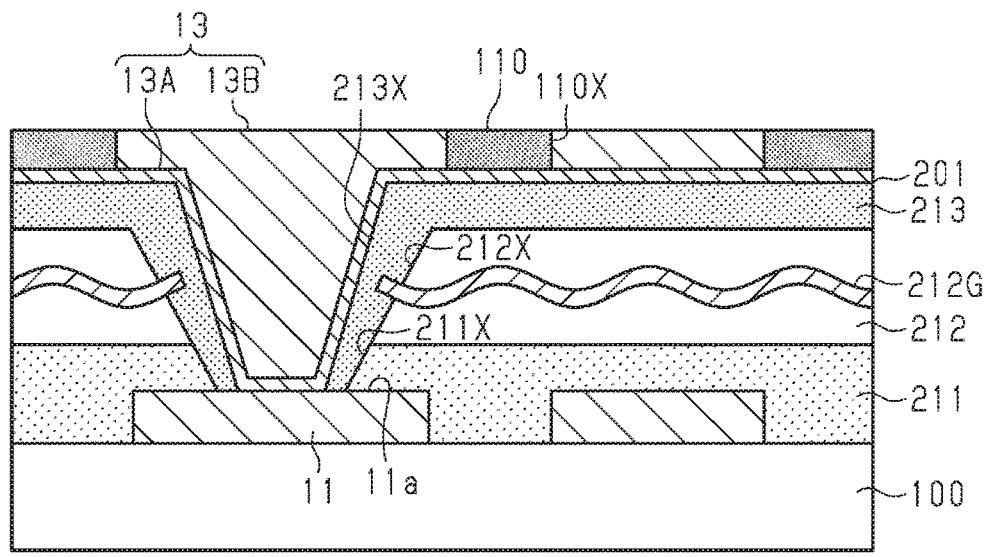

In the step illustrated in FIG. 10B, the resist layer 110 is formed. The resist layer 110 includes the opening 110X in a position in which the wiring layer 13 is formed. The material of the resist layer 110 may have resistance to plating that is performed in the next step. Next, electrolytic plating (in the present example, electrolytic copper plating) that uses the seed layer 13A as a power feeding electrode is performed so that a plating metal deposits and develops on the seed layer 13A exposed in the opening 110X of the resist layer 110 to form the metal layer 13B.

Figure 10C:
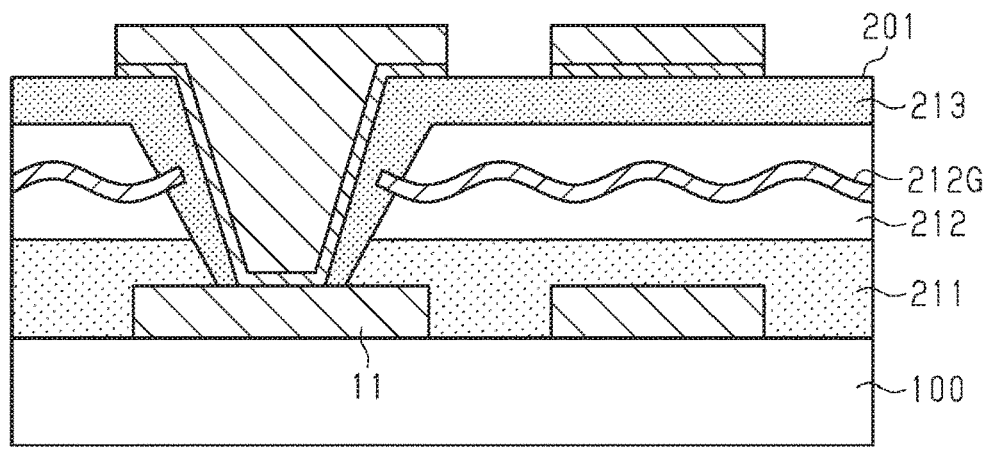

In the step illustrated in FIG. 10C, the resist layer 110 illustrated in FIG. 10B is removed. Additionally, the seed layer 13A exposed from the metal layer 13B, that is, a portion of the seed layer 13A not present in the final device, is removed. The resist layer 110 may be removed, for example, by ashing or using an alkaline stripping solution. The portion of the seed layer 13A is removed, for example, by etching. This forms the wiring layer 13 that includes the via portions 13V and the wiring portions 13P (refer to FIG. 2).

The steps of forming the insulation layer 201 and the wiring layer 13 illustrated in FIG. 7 have been described. The remaining insulation layers 202 and 203 and wiring layers 15 and 17 illustrated in FIG. 6 are formed by the same steps described above with regard to the insulation layer 201 and the wiring layer 13. The insulation layer 202 is formed on the upper surface 201a of the insulation layer 201 instead of the support 100. The insulation layer 203 is formed on the upper surface 202a of the insulation layer 202.

In the wiring substrate 200 of the second embodiment, the insulation layer 213, which does not include reinforcement materials, covers the upper surface 212a of the insulation layer 212 including the reinforcement material 212G and the wall surfaces of the openings 211X and 212X. Thus, the wiring substrate 200 of the second embodiment has the same advantages as those of the first embodiment.

The wiring substrate 200 of the second embodiment further has the advantages described below in addition to the advantages of the first embodiment.

(2-1) The insulation layer 211 covers the upper surface 11a and the side surfaces 11c of the wiring layer 11, and the insulation layer 212 including the reinforcement material 212G is formed on the upper surface 211a of the insulation layer 211. The resin material used as the insulative resin of the insulation layer 211 is less viscous than that of the insulative resin of the insulation layer 212. Thus, the insulation layer 211 is sufficiently embedded between wiring patterns of the wiring layer 11 and has a satisfactory adhesion to the upper surface 11a and the side surfaces 11c of the wiring layer 11.

(2-2) A material that demonstrates satisfactory adhesion between the insulation layer 211 and the wiring layer 11 is used as the material of the insulation layer 211. This further increases the adhesion between the insulation layer 211 and the wiring layer 11.

(2-3) The upper surface 211a of the insulation layer 211 is flattened. This stabilizes the position of the reinforcement material 212G in the insulation layer 212 formed on the upper surface 211a of the insulation layer 211.

It should be apparent to those skilled in the art that the foregoing embodiments may be implemented in many other specific forms without departing from the scope of this disclosure. Particularly, it should be understood that the foregoing embodiments may be implemented in the following forms.

The above embodiments and the following modifications may be combined as long as the combined modifications do not technically contradict one another.

In the first embodiment, at least one of the insulation layers 12, 14, and 16 may include a reinforcement material. Also, in the second embodiment, at least one of the insulation layers 201 to 203 may include a reinforcement material. In each embodiment, the number of insulation layers may be two or four or more.

In each embodiment, the openings 22X and 213X are formed in the insulation layers 22 and 213 by laser drilling but may be formed by another process such as photolithography.

CLAUSES

This disclosure further encompasses the following embodiments.

1. A method for manufacturing a wiring substrate, the method including:

forming a first wiring layer;

forming a first insulation layer from an insulative resin that includes a reinforcement material, wherein the first insulation layer covers the first wiring layer;

irradiating the first insulation layer with a laser beam to form a first opening that extends through the reinforcement material and exposes a partial region of an upper surface of the first wiring layer, wherein the first opening has an open width that decreases from an upper surface of the first insulation layer toward the first wiring layer;

forming a second insulation layer from an insulative resin that does not include a reinforcement material, wherein the second insulation layer covers the upper surface of the first insulation layer, a wall surface of the first opening, and the partial region of the upper surface of the first wiring layer exposed in the first opening;

irradiating the second insulation layer with a laser beam to form a second opening, wherein the second opening extends through the second insulation layer located in the first opening and exposes a part of the partial region of the upper surface of the first wiring layer so that the second insulation layer covers an entire surface of the reinforcement material projecting in the first opening, and the second opening has an open width that decreases from an upper surface of the second insulation layer toward the first wiring layer; and forming a second wiring layer that includes a wiring portion arranged on the upper surface of the second insulation layer and a via portion arranged in the second opening to connect the wiring portion to the first wiring layer.

2. The method according to clause 1, further including forming a third insulation layer from an insulative resin that does not include a reinforcement material, wherein the third insulation layer covers the upper surface of the first wiring layer and a side surface of the first wiring layer, wherein the first insulation layer is formed on an upper surface of the third insulation layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate, comprising:

a first wiring layer;

a first insulation layer formed from an insulative resin that includes a reinforcement material, wherein the first insulation layer includes a first opening extending through the reinforcement material and exposing a partial region of an upper surface of the first wiring layer, and the reinforcement material has an end projecting in the first opening;

a second insulation layer formed from an insulative resin that does not include a reinforcement material and covering an upper surface of the first insulation layer, a wall surface of the first opening, and a first part of the partial region of the upper surface of the first wiring layer exposed in the first opening, wherein the second insulation layer includes a second opening exposing a second part of the partial region of the upper surface of the first wiring layer in the first opening and covers an entire surface of the reinforcement material projecting in the first opening; and a second wiring layer that includes a wiring portion formed on an upper surface of the second insulation layer and a via portion formed in the second opening and connecting the wiring portion to the first wiring layer, wherein the first opening of the first insulation layer has an open width that decreases from the upper surface of the first insulation layer toward the first wiring layer, the second opening of the second insulation layer has an open width that decreases from the upper surface of the second insulation layer toward the first wiring layer, and the first opening of the first insulation layer has an inclination angle that is smaller than that of the second opening of the second insulation layer.

2. The wiring substrate according to claim 1, wherein a thickness from the reinforcement material to the upper surface of the first wiring layer is equal to a thickness from the reinforcement material to the upper surface of the second insulation layer.

3. The wiring substrate according to claim 1, further comprising a third insulation layer formed from an insulative resin that does not include a reinforcement material and covering a portion of the upper surface of the first wiring layer and a side surface of the first wiring layer, wherein the third insulation layer includes a third opening exposing the partial region of the upper surface of the first wiring layer, and the first insulation layer covers an upper surface of the third insulation layer.

4. The wiring substrate according to claim 3, wherein the insulative resin of the third insulation layer is less viscous than the insulative resin of the first insulation layer.

5. The wiring substrate according to claim 1, wherein the second wiring layer includes a seed layer arranged on the upper surface of the second insulation layer, a wall surface of the second opening, and the second part of the upper surface of the first wiring layer exposed in the second opening, wherein the seed layer is formed from an electroless plating metal, and a metal layer formed on the seed layer, and the insulative resin of the second insulation layer has greater adhesion to the seed layer than the insulative resin of the first insulation layer.

6. A wiring substrate, comprising:

a first wiring layer;

a first insulation layer formed from an insulative resin that includes a reinforcement material, wherein the first insulation layer includes a first opening extending through the reinforcement material and exposing a partial region of an upper surface of the first wiring layer, and the reinforcement material has an end projecting in the first opening;

a second insulation layer formed from an insulative resin that does not include a reinforcement material and covering an upper surface of the first insulation layer, a wall surface of the first opening, and a first part of the partial region of the upper surface of the first wiring layer exposed in the first opening, wherein the second insulation layer includes a second opening exposing a second part of the partial region of the upper surface of the first wiring layer in the first opening and covers an entire surface of the reinforcement material projecting in the first opening; and a second wiring layer that includes a wiring portion formed on an upper surface of the second insulation layer and a via portion formed in the second opening and connecting the wiring portion to the first wiring layer, wherein the first opening of the first insulation layer has an open width that decreases from the upper surface of the first insulation layer toward the first wiring layer, the second opening of the second insulation layer has an open width that decreases from the upper surface of the second insulation layer toward the first wiring layer, and a thickness from the reinforcement material to the upper surface of the first wiring layer is equal to a thickness from the reinforcement material to the upper surface of the second insulation layer.

7. The wiring substrate according to claim 6, further comprising a third insulation layer formed from an insulative resin that does not include a reinforcement material and covering a portion of the upper surface of the first wiring layer and a side surface of the first wiring layer, wherein the third insulation layer includes a third opening exposing the partial region of the upper surface of the first wiring layer, and the first insulation layer covers an upper surface of the third insulation layer.

8. The wiring substrate according to claim 7, wherein the insulative resin of the third insulation layer is less viscous than the insulative resin of the first insulation layer.

9. The wiring substrate according to claim 6, wherein the second wiring layer includes a seed layer arranged on the upper surface of the second insulation layer, a wall surface of the second opening, and the second part of the upper surface of the first wiring layer exposed in the second opening, wherein the seed layer is formed from an electroless plating metal, and a metal layer formed on the seed layer, and the insulative resin of the second insulation layer has greater adhesion to the seed layer than the insulative resin of the first insulation layer.

10. A wiring substrate, comprising:

a first wiring layer;

a first insulation layer formed from an insulative resin that includes a reinforcement material, wherein the first insulation layer includes a first opening extending through the reinforcement material and exposing a partial region of an upper surface of the first wiring layer, and the reinforcement material has an end projecting in the first opening;

a second insulation layer formed from an insulative resin that does not include a reinforcement material and covering an upper surface of the first insulation layer, a wall surface of the first opening, and a first part of the partial region of the upper surface of the first wiring layer exposed in the first opening, wherein the second insulation layer includes a second opening exposing a second part of the partial region of the upper surface of the first wiring layer in the first opening and covers an entire surface of the reinforcement material projecting in the first opening; and a second wiring layer that includes a wiring portion formed on an upper surface of the second insulation layer and a via portion formed in the second opening and connecting the wiring portion to the first wiring layer, wherein the first opening of the first insulation layer has an open width that decreases from the upper surface of the first insulation layer toward the first wiring layer, and the second opening of the second insulation layer has an open width that decreases from the upper surface of the second insulation layer toward the first wiring layer, the wiring substrate further comprising a third insulation layer formed from an insulative resin that does not include a reinforcement material and covering a portion of the upper surface of the first wiring layer and a side surface of the first wiring layer, wherein the third insulation layer includes a third opening exposing the partial region of the upper surface of the first wiring layer, and the first insulation layer covers an upper surface of the third insulation layer.

11. The wiring substrate according to claim 10, wherein the insulative resin of the third insulation layer is less viscous than the insulative resin of the first insulation layer.

12. The wiring substrate according to claim 10, wherein the second wiring layer includes a seed layer arranged on the upper surface of the second insulation layer, a wall surface of the second opening, and the second part of the upper surface of the first wiring layer exposed in the second opening, wherein the seed layer is formed from an electroless plating metal, and a metal layer formed on the seed layer, and the insulative resin of the second insulation layer has greater adhesion to the seed layer than the insulative resin of the first insulation layer.

* * * * *